United States Patent [19]

Oida

[11] Patent Number: 4,606,059

[45] Date of Patent: Aug. 12, 1986

[54] VARIABLE FREQUENCY DIVIDER
[75] Inventor: Yoshio Oida, Funabashi, Japan
[73] Assignee: Tokyo Shibaura Denki Kabushiki Kaisha, Kawasaki, Japan
[21] Appl. No.: 592,849
[22] Filed: Mar. 23, 1984
[30] Foreign Application Priority Data
  Mar. 31, 1983 [JP] Japan .................................. 58-55964
[51] Int. Cl.⁴ .......................................... H03K 21/06
[52] U.S. Cl. ....................................... 377/47; 377/72; 377/73; 377/54; 377/108
[58] Field of Search ................... 377/54, 47, 108, 110, 377/111, 48; 364/703

[56] References Cited
U.S. PATENT DOCUMENTS

| 3,745,315 | 7/1973 | Brendzel | 377/108 |
| 3,987,313 | 10/1976 | Pfleiderer et al. | 377/104 |
| 4,354,188 | 10/1982 | Schneider | 377/48 |
| 4,390,960 | 6/1983 | Yamashita et al. | 377/54 |

FOREIGN PATENT DOCUMENTS

| 067285 | 12/1982 | European Pat. Off. | |
| 0095777 | 12/1983 | European Pat. Off. | 377/52 |
| 2629750 | 1/1978 | Fed. Rep. of Germany . | |
| 2107094 | 4/1983 | United Kingdom . | |

OTHER PUBLICATIONS

Japanese Patent Disclosure (Kokai) No. 54-46463, Dec. 1983.

Primary Examiner—Stanley D. Miller
Assistant Examiner—Karl Ohralik
Attorney, Agent, or Firm—Finnegan, Henderson, Farabow, Garrett & Dunner

[57] ABSTRACT

A variable frequency divider which includes a feedback shift register having a feedback gate of NOR type, a delay shift register for delaying output data from the feedback shift register by one clock, a control shift register having a control gate of AND type, a feedback circuit for feeding output data from the delay shift register and from the control shift register back to the feedback gate, and an expander which receives output data from the feedback shift register and produces a control signal according to said frequency dividing input and a frequency division ratio instruction signal. The control gate receives output data from the delay shift register and the control signal.

18 Claims, 9 Drawing Figures

VARIABLE FREQUENCY DIVIDER

BACKGROUND OF THE INVENTION

The present invention relates to a variable frequency divider suitably adapted for a frequency synthesizer tuner of a television receiver, radio transmitter/receiver (tranceiver), etc.

FIG. 1 shows a conventional variable frequency divider which is used as a dual modulus prescaler in a frequency synthesizer tuner. FIG. 1 corresponds to, e.g., UHF programmable divider #SP8743B & M manufactured by the Plessey Company Limited (England). In FIG. 1, reference numerals 1 to 3 denote shift resisters (D flip-flops); 4 to 6 denote gate circuits; 7 denotes an expander (T flip-flop); CP denotes a clock input; and $\overline{PE}$ denotes a frequency division ratio instruction signal. This variable frequency divider operates in a well known manner; the frequency division ratio for a frequency divided output OUT with respect to an input clock CL is set to either ⅛ or 1/9 in accordance with the logic level of signal $\overline{PE}$.

The maximum operating frequency of the variable frequency divider as shown in FIG. 1 is determined by the signal propagation time of shift registers 1 to 3 and of gate circuits 4 to 6. The maximum operating frequency of the variable frequency divider is given by:

$$1/(\tau D + \tau G)$$

where $\tau D$ is a propagation delay time of the shift registers 1 to 3 and $\tau G$ is a propagation delay time of the gate circuits 4 to 6.

To obtain a high-speed operation of the variable frequency divider, high-speed ECL (emitter-coupled logic) shift registers of master-slave type are used for shift registers 1 to 3. The maximum operating frequency of such ECL shift registers is, at present, about 1 GHz, and that of the gate circuits is also about 1 GHz. Accordingly, the maximum operating frequency of the variable frequency divider becomes about 500 MHz. However, demand for dual modulus prescalers with still higher-speed operation and lower power consumption has become strong.

SUMMARY OF THE INVENTION

It is accordingly the object of the present invention to provide a variable frequency divider whose maximum operating speed can reach that of the shift registers used yet, with low power consumption.

A variable frequency divider of the present invention includes a feedback shift register having a feedback NOR or OR gate; a delay shift register for delaying output data from the feedback shift register by one clock; a control shift register having a control AND or NAND gate which receives output data from the delay shift register and receives a control signal; a feedback circuit for feeding the output data from the control and delay shift registers back to the feedback NOR or OR gate; and an expander which receives as a frequency dividing input the output data from the feedback shift register and produces the control signal from the frequency dividing input and from a frequency division ratio instruction signal.

In the variable frequency divider, the maximum operating speed is restricted substantially only by the propagation delay time of the shift registers with gates. When high-speed shift registers (e.g., ECL shift registers) are used, a variable frequency divider with a maximum operating speed as high as about 1 GHz can be obtained. Further, current sources exclusively provided for the gates can be omitted, thereby obtaining low power consumption.

DETAILED DESCRIPTION OF THE PREFERRED EMBODIMENTS

Figure 1:
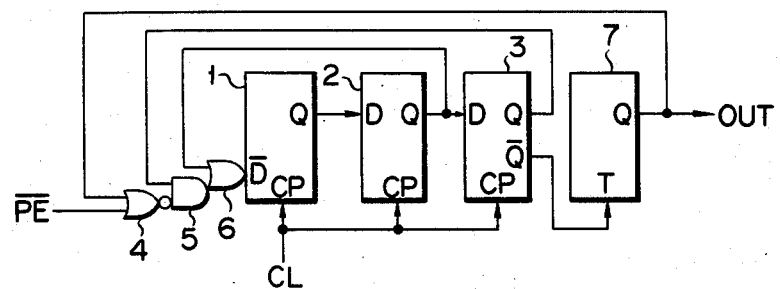
FIG. 1 shows a conventional variable frequency divider.
Figure 2:
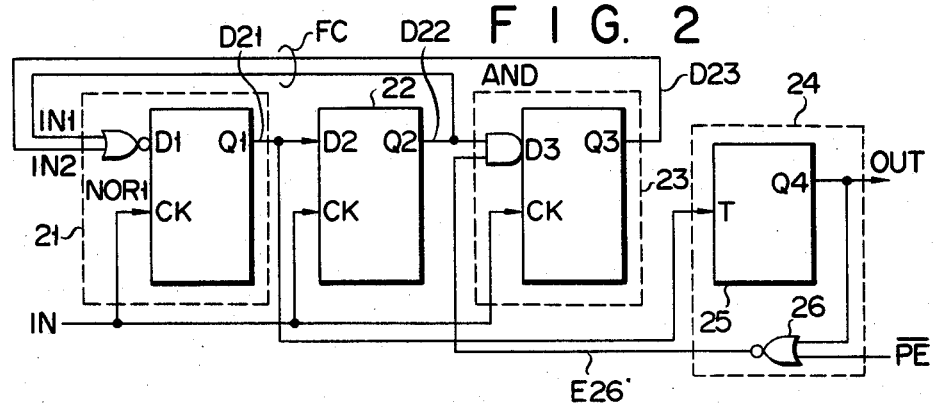
FIG. 2 shows the configuration of an embodiment of a variable frequency divider according to the present invention.

The preferred embodiment of the present invention will now be described with reference to the accompanying drawings. Referring to FIG. 2, reference numerals 21 to 23 denote high-speed ECL shift registers (D flip-flop) which are provided with clock terminals CK for receiving a clock input IN. In these shift registers 21 to 23, shift register 21 serves as a feedback shift register which has a 2-input NOR gate at the data input terminal D1. Shift register 22 serves as a delay shift register which receives, at the data input terminal D2, data D21 from the data output terminal Q1 of shift register 21 and which delays the input data by one clock pulse of clock input IN. Shift register 23 has a 2-input AND gate at the data input terminal D3. One input terminal of the AND gate receives data D22 from the data output terminal Q2 of shift register 22, and the other input terminal thereof receives a control signal E26 from expander 24 to be described later.

Shift register 23 serves as a control shift register which controls, in accordance with the logic level of control signal E26, whether or not the data D22 from shift register 22 is to be delayed by one clock pulse of signal IN. Output data D23, D22 from the data output terminal Q3 of shift register 23 and from the data output terminal Q2 of shift register 22 respectively are fed back to the feedback NOR gate of shift register 21. Expander 24 may be formed of a toggle-type flip-flop (T flip-flop) 25 and a 2-input NOR gate 26. T flip-flop 25 receives, at its toggle input terminal T, the output data D21 from shift register 21 as a frequency dividing input. Variable frequency divided output (⅛ frequency divided or 1/9 frequency divided output) is produced from the data output terminal Q4 of T flip-flop 25. Frequency divided output OUT and frequency division ratio instruction signal $\overline{PE}$ are supplied to NOR gate 26. An output from NOR gate 26 is supplied as control signal E26 to the AND gate of shift register 23.

Figure 3:
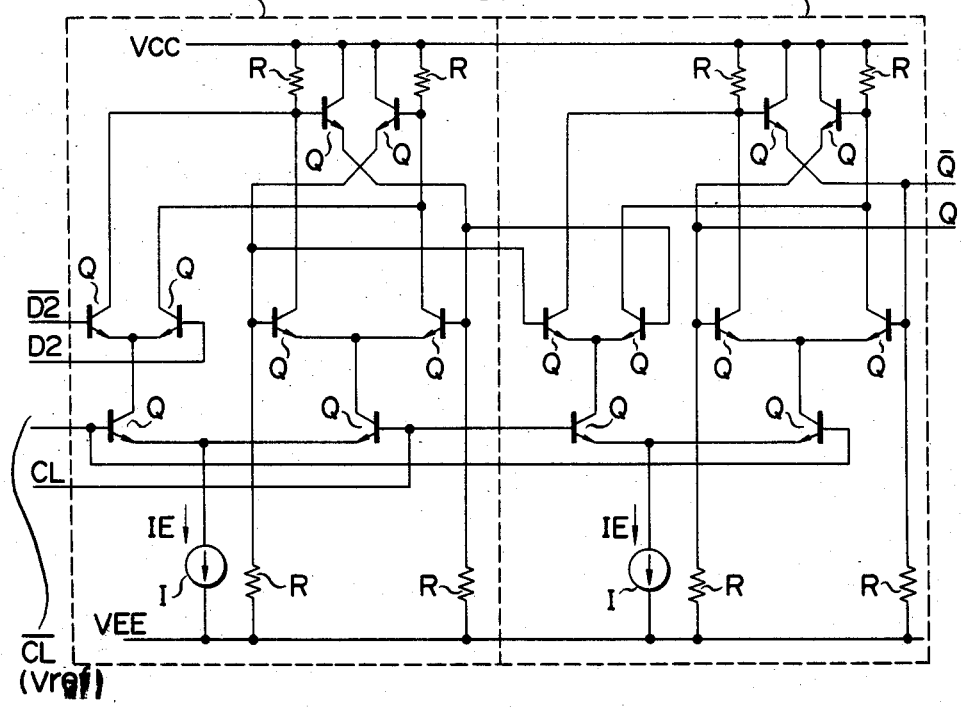
FIG. 3 shows details of master-slave type shift registers (D flip-flops) used in the frequency divider of FIG. 2.
Figure 4:
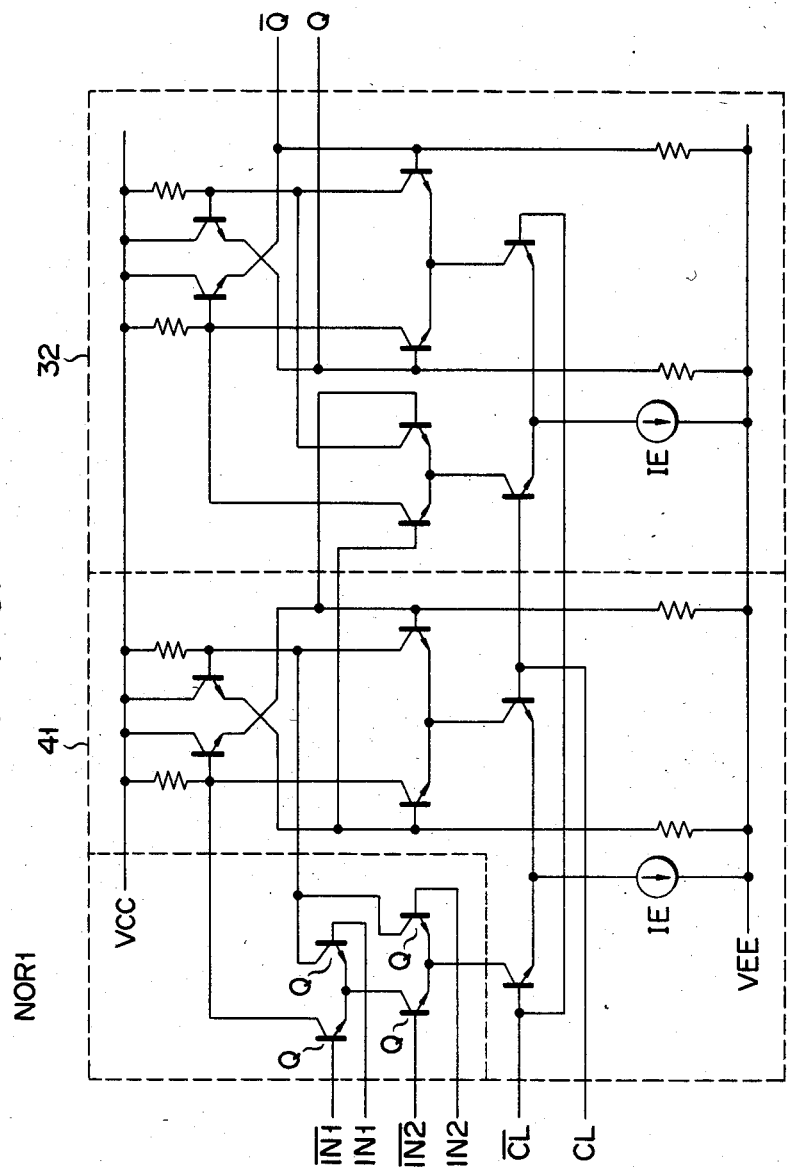
FIG. 4 shows details of a shift register having a NOR gate at its input circuit, which is used in the frequency divider of FIG. 2.

Shift registers 21 to 23 are of master-slave type. The circuit configuration of shift register 22 is shown in FIG. 3. Referring to FIG. 3, reference symbol VCC denotes a high-potential power source; VEE denotes a low-potential power source; 31 indicates a master-side flip-flop; 32 indicates a slave-side flip-flop; R denotes resistors; Q denotes NPN transistors; and I denotes a constant current source for feeding a current IE. Shift register 21 has the configuration as shown in FIG. 4. Remaining portions may be substantially the same as that shown in FIG. 3 except in the following respects. In FIG. 4, there is provided a NOR gate (NOR1) having NPN transistors Q at the data input terminals of master-side flip-flop 41. Clock input terminal CK of FIG. 2 corresponds to $\overline{CL}$ and CL in FIG. 4.

Shift register 23 may have the same configuration as that of shift register 21, with proper modifications of input wiring and output phasing of the input gate (AND). Accordingly, illustration of details of shift register 23 will be omitted.

Figure 5:
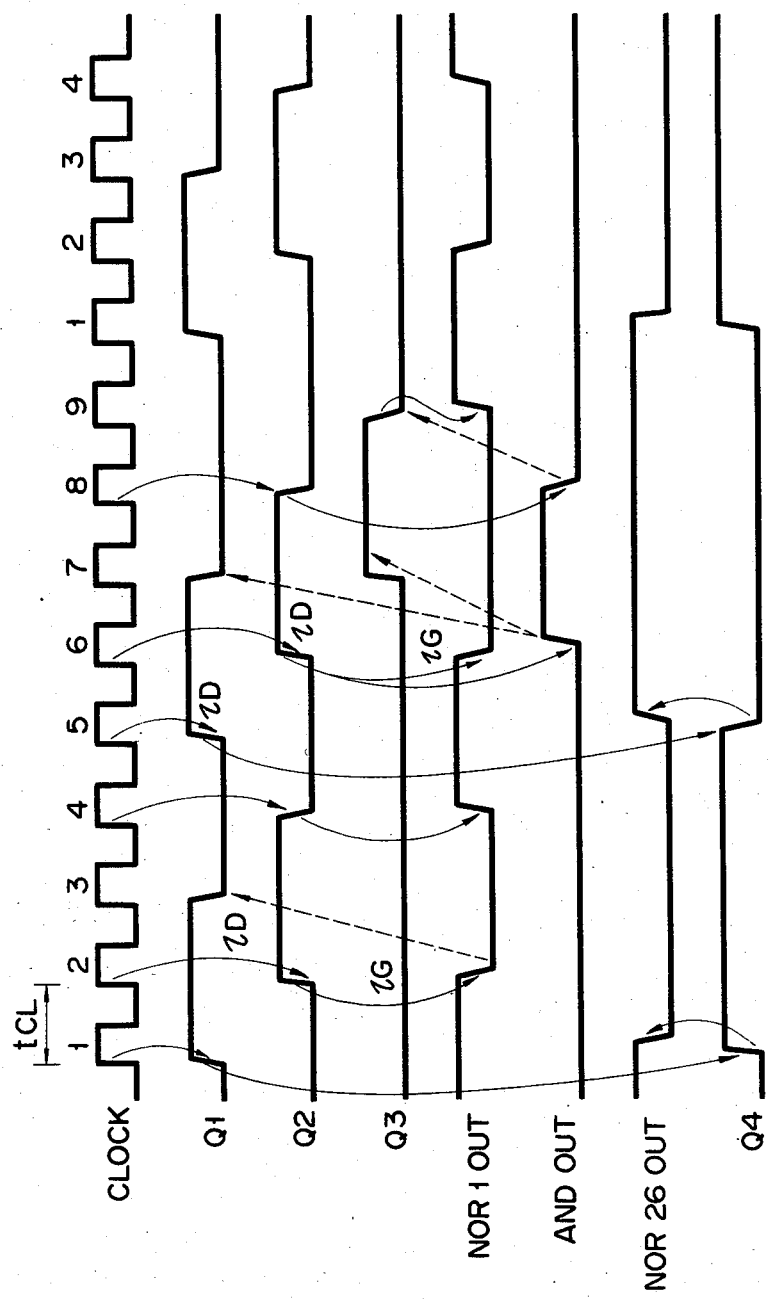
FIG. 5 is a timing chart illustrating the timings of signals in the 1/9 frequency dividing mode of the frequency divider shown in FIG. 2.

In the variable frequency divider shown in FIG. 2, when the instruction signal $\overline{PE}$ becomes high level, control signal E26 from NOR gate 26 becomes low level so that the AND gate is closed. $\frac{1}{8}$ frequency division is performed by shift registers 21 and 22. A $\frac{1}{8}$ frequency divided output OUT is produced from expander 24. In contrast to this, when the instruction signal $\overline{PE}$ goes low, shift register 23 with the AND gate is activated. Then, shift registers 21 and 22 start to count pulses numbering one more than that counted in the above case. Expander 24 in this case produces a 1/9 frequency divided output at OUT. FIG. 5 shows the timing of signals associated with the above frequency dividing operation.

The variable frequency divider operates in a normal mode, when $$\tau D + \tau G < tCL$$

where tCL is the period of clock input IN, and $\tau D$ and $\tau G$ are propagation delay times in shift and gate operations, respectively. On the other hand, the variable frequency divider does not operate as in the normal mode and a larger number of clock pulses than those counted in the normal mode are counted, when $$\tau D + \tau G > tCL$$

However, in the case of an ECL-type shift register, since the propagation delay time corresponds to that of the gate operation, we can assume that $\tau D = \tau G$. When shift registers 21 to 23 of the invention are, e.g., ECL-type shift registers with proper input gates, we can assume that $\tau D = 0$ and $\tau D + \tau G = \tau D$.

In a variable frequency divider of the present invention, a normal mode operation can be performed for $\tau D < tCL$ and the maximum operating frequency can be improved as much as two fold over the prior art, without changes in device characteristics. Further, special current sources exclusively used for NOR and AND input gates are not required, so that overall power consumption can be reduced.

When multicollector transistors are used for ECL shift registers 21 to 23, the parasitic collector capacitance is reduced and operation at still higher speeds can be performed.

Figure 6:
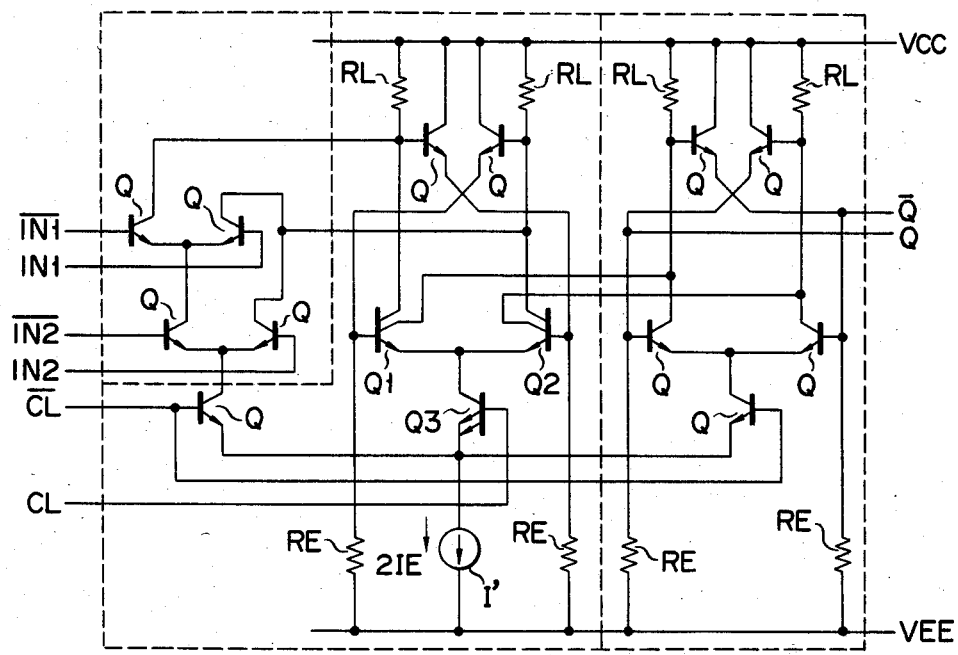
FIG. 6 shows a modification of the shift register of FIG. 4.

FIG. 6 shows an example of a shift register with a NOR gate, which includes multicollector transistors. The shift register of FIG. 6 corresponds to the shift register of FIG. 4. Referring to FIG. 6, reference numerals Q1 and Q2 denote NPN multicollector transistors; Q3 denotes a NPN multiemitter transistor; I' denotes a constant current source of current 2IE; RL denotes load resistors; and RE denotes emitter resistors. The remaining parts in FIG. 6 are the same as those shown in FIG. 4.

The above embodiment is described with reference to a $\frac{1}{8}$ or 1/9 frequency dividing dual modulus prescaler. However, a switching between moduli $\frac{1}{8}(n+1)$ and $1/\{2(n+1)+1\}$ (where n is a natural number such as 1, 2, 3 and so on) can be performed by properly modifying the configuration of expander 24.

Figure 7:
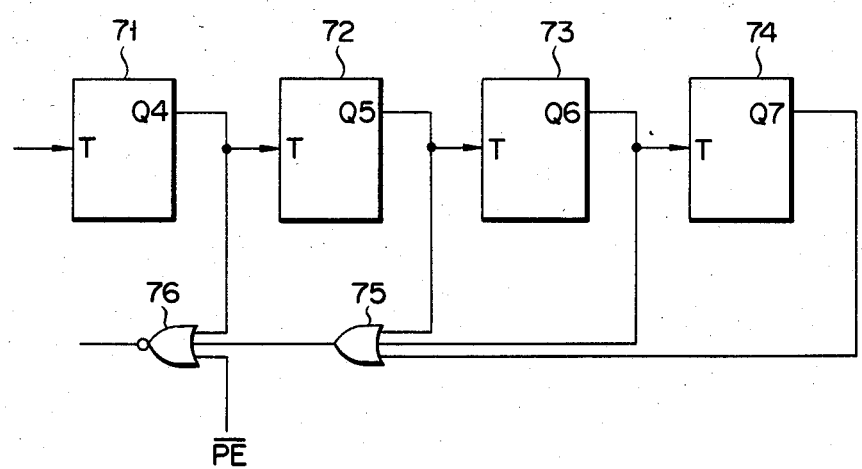
FIG. 7 shows a partial modification of the configuration shown in FIG. 2.

FIG. 7 shows an expander for switching between moduli 1/64 and 1/65 (n=31). In FIG. 7, reference numerals 71 to 74 denote T-type flip-flops; 75 denotes an OR gate; and 76 denotes a NOR gate.

In the variable frequency divider of the invention, a NOR gate is used for the input gate of shift register 21. However, an OR gate may be used for the input gate of shift register 21. In this case, shift register 23 with an AND gate is replaced with a shift register with a NAND gate.

Figure 8:
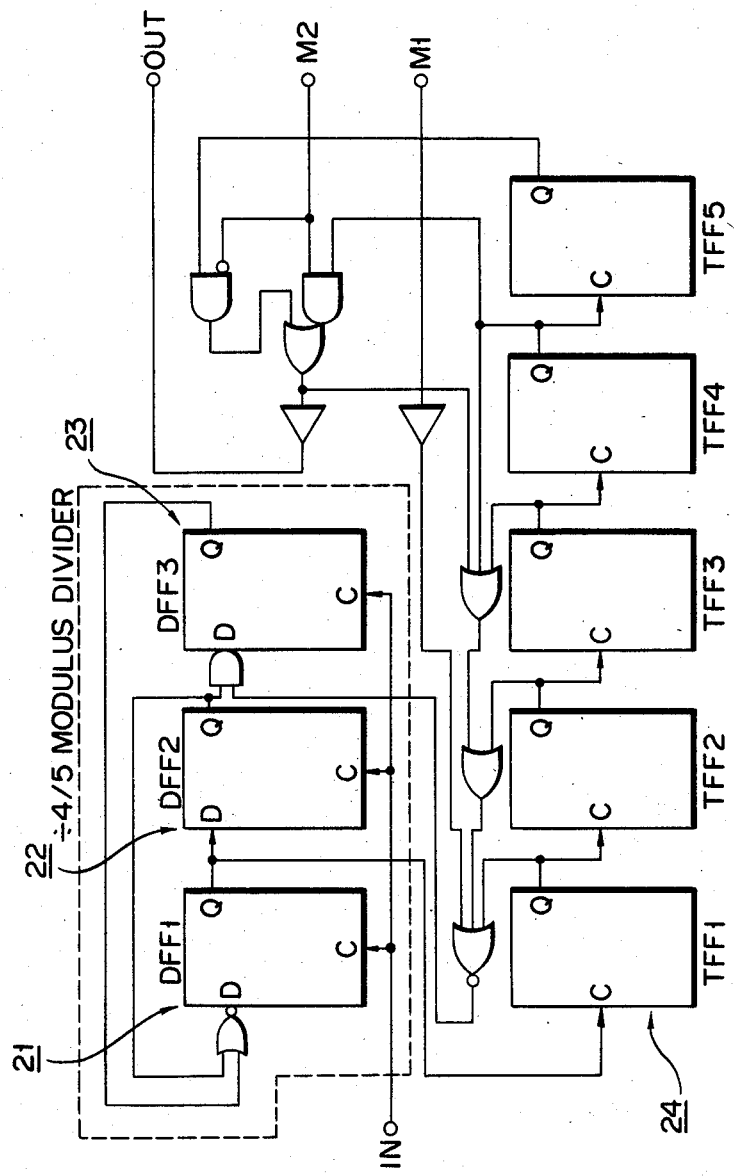
FIG. 8 shows the configuration of another embodiment of a variable frequency divider according to the present invention, which is well adapted to a GaAs IC device.

FIG. 8 shows the configuration of another embodiment of a variable frequency divider according to the present invention, which is well adapted to a GaAs IC device. The configuration of FIG. 8 includes $\frac{1}{4}$ or 1/5 frequency divider which is formed of a NOR input D flip-flop, a D flip-flop and an AND input D flip-flop. Instruction inputs M1 and M2 correspond to $\overline{PE}$ of FIG. 2.

Figure 9:
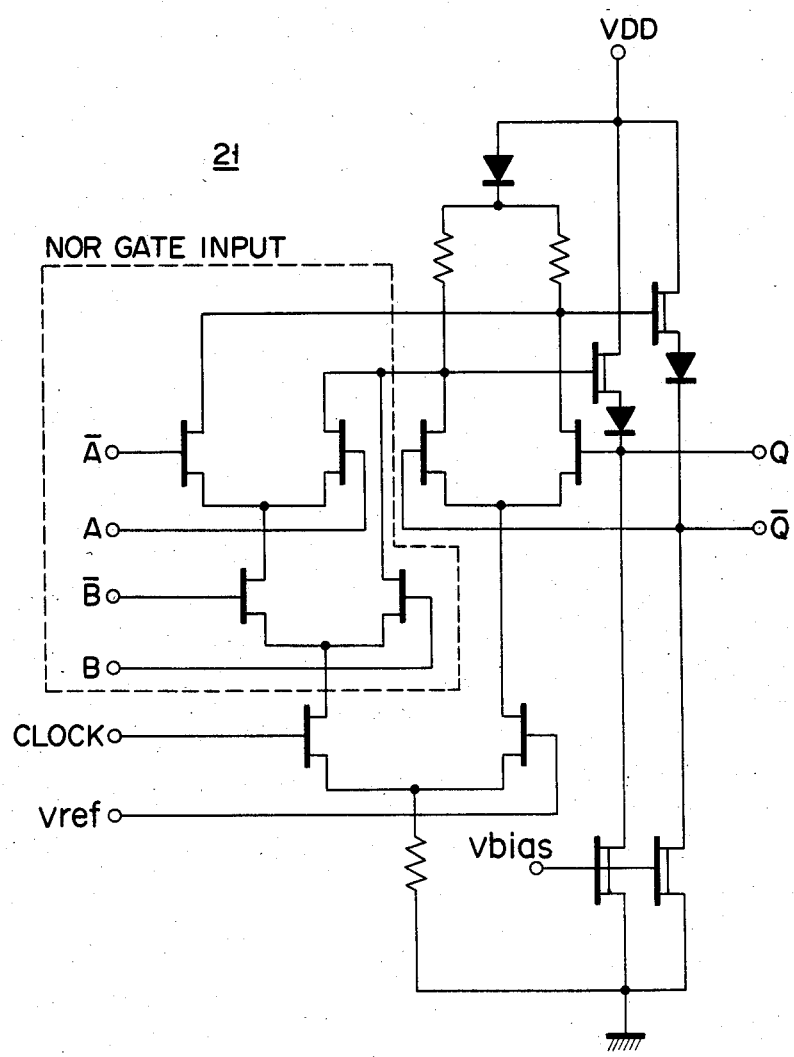
FIG. 9 shows details of a GaAs source-coupled FET logic type shift register having a NOR gate at its input circuit, which is used in the frequency divider of FIG. 8.

FIG. 9. shows details of a GaAs source-coupled FET logic type shift register having a NOR gate at its input circuit, which may be used in the frequency divider of FIG. 8. The shift register of FIG. 9 is a master flip-flop in a master-slave D flip-flop. Enhancement FETs are used for differential transistors and depletion FETs are used for source follower transistors. The reason why such types of FETs are used is that the power consumption of enhancement FETs is very small while the drivability for other circuits of depletion FETs is better than that of enhancement FETs. The stacked gate configuration produces complementary NOR gate inputs A and $\overline{A}$, and B and $\overline{B}$. The complete differential operation brings about good noise margin. Accordingly, the configuration of FIG. 9 assures a certain gate function. Interchanging A with $\overline{A}$ and B with $\overline{B}$, respectively, the circuit operates as an AND gate input master flip-flop for the master-slave D flip-flop.

In summary, in the variable frequency divider of the present invention, the maximum operating speed can be increased near to that of the shift register used. At present, this is approximately 1 GHz for ECL devices. In addition to this, power consumption can be reduced. The feature of high-speed operation of the invention improves response characteristics of fine tuning of a frequency synthesizer tuner, that of PLL (phase-locked loop) of a circuit used in a high-speed operating equipment, etc., thereby expanding the utility range of a variable frequency divider according to the present invention.

What is claimed is:

1. A variable frequency divider adapted to receive a clock signal and a division ratio instruction signal, said variable frequency divider comprising:

feedback shift register means, responsive to said clock signal and provided with a feedback gate having feedback input terminals, for providing first output data according to the logical state of said feedback input terminals and said clock signal;

delay shift register means, responsive to said clock signal and coupled to said feedback shift register means, for delaying said first output data by one clock period of said clock signal, and for providing second output data;

control shift register means, responsive to said clock signal and provided with a control gate having first and second control input terminals receiving, respectively, a control signal and said second output data, for providing third output data according to the logical state of said control input terminals and said clock signal;

feedback circuit means, coupled to said feedback input terminals and to said control shift register means, for feeding said second and third output data directly back to said feedback input terminals; and expander means, coupled to said feedback shift register means and to said first control input terminal of said control gate, for providing said control signal according to said first output data and said division ratio instruction signal.

2. A variable frequency divider according to claim 1, wherein said feedback gate includes a NOR gate.

3. A variable frequency divider according to claim 2, wherein said control gate includes an AND gate.

4. A variable frequency divider according to claim 1, wherein said control gate includes a an AND gate.

5. A variable frequency divider according to claim 3, wherein said feedback shift register means includes a D type flip-flop whose D input terminal is coupled to the output of said feedback gate and whose Q output provides said first output data.

6. A variable frequency divider according to claim 4, wherein said feedback shift register means includes a D type flip-flop whose D input terminal is coupled to the output of said feedback gate and whose Q output provides said first output data.

7. A variable frequency divider according to claim 5, wherein said delay shift register means includes a D type flip-flop whose D input terminal is coupled to the output of said feedback shift register means and whose Q output provides said second output data.

8. A variable frequency divider according to claim 6, wherein said delay shift register means includes a D type flip-flop whose D input terminal is coupled to the output of said feedback shift register means and whose Q output provides said second output data.

9. A variable frequency divider according to claim 7, wherein said control shift register means includes a D type flip-flop whose D input terminal is coupled to the output of said control gate and whose Q output provides said third output data.

10. A variable frequency divider according to claim 8, wherein said control shift register means includes a D type flip-flop whose D input terminal is coupled to the output of said control gate and whose Q output provides said third output data.

11. A variable frequency divider according to claim 9, wherein said expander means includes:

a T type flip-flop whose T input terminal is coupled to the output of said feedback shift register means and whose Q output provides a frequency-divided signal corresponding to said control signal; and a gate circuit coupled to the output of said T type flip-flop and being responsive to said division ratio instruction signal, for providing said control signal according to the logical state of said frequency-divided signal or that of said division ratio instruction signal.

12. A variable frequency divider according to claim 10, wherein said expander means includes:

a T type flip-flop whose T input terminal is coupled to the output of said feedback shift register means and whose Q output provides a frequency-divided signal corresponding to said control signal; and a gate circuit coupled to the output of said T type flip-flop and being responsive to said division ratio instruction signal, for providing said control signal according to the logical state of said frequency-divided signal or that of said division ratio instruction signal.

13. A variable frequency divider according to claim 11, wherein said D type flip-flops and said T type flip-flop are formed of emitter-coupled logic shift registers.

14. A variable frequency divider according to claim 12, wherein said D type flip-flops and said T type flip-flop are formed of emitter-coupled logic shift registers.

15. A variable frequency divider according to claim 13, wherein said D type flip-flops include multicollector transistors.

16. A variable frequency divider according to claim 14, wherein said D type flip-flops include multicollector transistors.

17. A variable frequency divider according to claim 11, wherein said D type flip-flops are formed of GaAs source-coupled FET logic circuits.

18. A variable frequency divider according to claim 12, wherein said D type flip-flops are formed of GaAs source-coupled FET logic circuits.

* * * * *